United States Patent
Stiver et al.

(10) Patent No.: US 9,565,790 B1
(45) Date of Patent: *Feb. 7, 2017

(54) DATA CENTER THERMAL MONITORING

(71) Applicant: Google Inc., Mountain View, CA (US)

(72) Inventors: David W. Stiver, Santa Clara, CA (US); Gregory P. Imwalle, Mountain View, CA (US)

(73) Assignee: Google Inc., Mountain View, CA (US)

( * ) Notice: Subject to any disclaimer, the term of this patent is extended or adjusted under 35 U.S.C. 154(b) by 504 days.

This patent is subject to a terminal disclaimer.

(21) Appl. No.: 14/176,327

(22) Filed: Feb. 10, 2014

Related U.S. Application Data

(63) Continuation of application No. 12/981,671, filed on Dec. 30, 2010, now Pat. No. 8,694,279.

(51) Int. Cl.
| | |
|---|---|
| *G01K 17/00* | (2006.01) |
| *G05D 9/00* | (2006.01) |
| *G05D 23/00* | (2006.01) |
| *H05K 7/20* | (2006.01) |
| *G06F 1/20* | (2006.01) |
| *G06F 1/32* | (2006.01) |

(52) U.S. Cl.
CPC ........... *H05K 7/20836* (2013.01); *G06F 1/206* (2013.01); *G06F 1/3203* (2013.01); *H05K 7/20745* (2013.01)

(58) Field of Classification Search
CPC . H05K 7/20836; H05K 7/20745; G06F 1/206; G06F 1/3203
USPC ..... 702/130–136; 700/291, 300; 165/104.33, 165/287
See application file for complete search history.

(56) References Cited

U.S. PATENT DOCUMENTS

| | | | |
|---|---|---|---|
| 6,340,874 B1 | 1/2002 | Vladimir | |
| 6,848,054 B1 | 1/2005 | Watts | |
| 7,461,272 B2 | 12/2008 | Rotem | |
| 7,495,985 B1 | 2/2009 | Reed | |
| 7,620,613 B1 | 11/2009 | Moore | |
| 7,644,051 B1 | 1/2010 | Moore | |
| 7,676,280 B1 | 3/2010 | Bash | |
| 7,979,250 B2 | 7/2011 | Archibald | |
| 7,991,515 B2 | 8/2011 | Lyon | |
| 8,223,025 B2 * | 7/2012 | Stiver | H05K 7/20836 340/506 |
| 8,694,279 B1 * | 4/2014 | Stiver | H05K 7/20836 165/104.33 |
| 2004/0158627 A1 | 8/2004 | Thornton | |
| 2004/0260957 A1 | 12/2004 | Jeddeloh | |

(Continued)

OTHER PUBLICATIONS

Office Action issued in U.S. Appl. No. 12/981,671 on Mar. 14, 2013, 22 pages.

(Continued)

*Primary Examiner* — An Do
(74) *Attorney, Agent, or Firm* — Fish & Richardson P.C.

(57) ABSTRACT

A system includes a first computing component and a second computing component. A first measurement indicative of a temperature of a first computing component is received. A second measurement indicative of a temperature of a second computing component is received. A thermal value is calculated for the first computing component based on the first measurement and the second measurement. In response to determining that the calculated thermal value exceeds the threshold, an operational or physical parameter of the system is modified.

22 Claims, 4 Drawing Sheets

(56) References Cited

U.S. PATENT DOCUMENTS

| | | |
|---|---|---|
| 2004/0264124 A1 | 12/2004 | Patel |
| 2005/0055590 A1 | 3/2005 | Farkas |
| 2005/0138432 A1 | 6/2005 | Ransom |
| 2005/0216775 A1 | 9/2005 | Inoue |
| 2006/0064999 A1 | 3/2006 | Hermerding |
| 2006/0259793 A1 | 11/2006 | Moore |
| 2006/0262474 A1 | 11/2006 | Chen |
| 2007/0049134 A1 | 3/2007 | Conroy |
| 2007/0050650 A1 | 3/2007 | Conroy |
| 2007/0067136 A1 | 3/2007 | Conroy |
| 2007/0140030 A1 | 6/2007 | Wyatt |
| 2007/0168151 A1 | 7/2007 | Kernahan |
| 2007/0180117 A1 | 8/2007 | Matsumoto |
| 2008/0103634 A1 | 5/2008 | Santos |
| 2008/0232974 A1 | 9/2008 | Tsuchiya |
| 2009/0083506 A1 | 3/2009 | Reed |
| 2009/0115619 A1 | 5/2009 | Chen |
| 2009/0290625 A1 | 11/2009 | Riddle |
| 2009/0322150 A1 | 12/2009 | Cline |
| 2010/0023787 A1 | 1/2010 | Ho |
| 2010/0138530 A1 | 6/2010 | Brillhart |
| 2010/0235003 A1 | 9/2010 | Maly |
| 2010/0313203 A1 | 12/2010 | Dawson |
| 2010/0315223 A1 | 12/2010 | Gross |
| 2011/0016342 A1 | 1/2011 | Rowan |
| 2011/0029150 A1 | 2/2011 | Wyatt |
| 2011/0054714 A1 | 3/2011 | Santos |
| 2011/0055596 A1 | 3/2011 | Wyatt |
| 2011/0055597 A1 | 3/2011 | Wyatt |
| 2011/0113273 A1 | 5/2011 | Okitsu |
| 2011/0127834 A1 | 6/2011 | Cline |
| 2011/0185203 A1 | 7/2011 | Carlson |
| 2011/0245981 A1 | 10/2011 | Refai-Ahmed |
| 2011/0301777 A1 | 12/2011 | Cox |
| 2012/0159387 A1 | 6/2012 | Oh |

OTHER PUBLICATIONS

Notice of Allowance issued in U.S. Appl. No. 12/981,671 on Nov. 6, 2013, 15 pages.

* cited by examiner

DATA CENTER THERMAL MONITORING

CROSS-REFERENCE TO RELATED APPLICATION

This application is a continuation of U.S. application Ser. No. 12/981,671, filed Dec. 30, 2010, the contents of which is incorporated by reference.

TECHNICAL FIELD

This document relates to thermal monitoring of computers.

BACKGROUND

At least a portion of the power consumed by a microprocessor is transformed into heat. A pair of microprocessors mounted on a single motherboard can draw 200-400 watts or more of power. If that power draw is multiplied by several thousand (or tens of thousands) to account for the computers in a data center, the potential for heat generation can be appreciated. Not only must a data center operator pay for electricity to operate the computers, it must also pay to cool the computers. The cost of removing heat may be a major cost of operating large data centers.

In addition, components of a computer, such as a microprocessor, memory or disk drive, are subject to breakdown when subjected to high temperatures. A fan can provide a steady flow of air across the components of the computer to carry away heat, and heat sinks can be attached to some components, particularly the microprocessor, to improve thermal transfer to the surrounding air. Despite these precautions, computer components can still overheat and fail, particularly when operating at high utilization.

SUMMARY

Understanding the thermal health of computers (and other data interconnection infrastructure components, e.g., routers and the like) in a data center may be useful in certain situations. For example, if thermal health is known, it is possible to take corrective action, such as replacing components that have failed or are likely to fail, or shifting utilization to reduce load on a computer and thus reduce the likelihood of failure.

As an approximation, the heat generated by a computer is proportional to its utilization or power draw, and in some situations, utilization or power draw by a computer can be used for evaluation of its thermal health. However, even in a well-designed data center with proper airflow management, it is possible for heat generated by one computer to affect another computer, e.g., by radiation, advection, conduction, or convection. In general, a measurement of thermal health of a computer based on utilization or power draw by that computer may fail to take into account the thermal influence from other computers. Similarly, a measurement of thermal health of an aggregation of computers based on utilization or power draw by that aggregation may fail to take into account the thermal influence from computers that are not part of the aggregation. In order to correct this, a thermal influence matrix that takes into account the thermal contribution from other computers may be used when determining the thermal health of a computer or aggregation of computers.

In an aspect, a system includes a first computing component and a second computing component. A first measurement indicative of a temperature of a first computing component is received. A second measurement indicative of a temperature of a second computing component is received. A thermal value is calculated for the first computing component based on the first measurement and the second measurement. In response to determining that the calculated thermal value exceeds the threshold, an operational or physical parameter of the system is modified.

Implementations can include one or more of the following features. For example, the first measurement may include one or more of a power draw of the first computing component, a utilization of the first computing component, or a rotation rate of a fan of the first computing component. The second measurement may include one or more of a temperature of the second computing component, a power draw of the second computing component, a utilization of the second computing component, or a rotation rate of a fan of the second computing component. Receiving the first measurement or receiving the second measurement may include receiving multiple measurements of different types and calculating the thermal value may include combining the multiple measurements.

N measurements indicative of N computing components may be received. The N computing components may include the first computing component and the second computing component. A thermal value for each of the N computing components may be calculated based on the N measurements, where N>2. Calculating the thermal value may include matrix multiplication. Calculating the thermal value may include $[T]=[M][V]$, where $[T]$ is a $1 \times N$ matrix of thermal values for the N computing components, $[M]$ is an $N \times N$ matrix of thermal influence coefficients, and $[V]$ is a $1 \times N$ matrix of the N measurements. The N measurements may be power draws of the N computing components, utilizations of the N computing components, or rotation rates of fans of the N computing components. The thermal values may be aggregated and may be aggregated across one or more of a power domain, a cooling domain, a logical domain or a physical location domain.

Calculating the thermal value may include $[T]=[M1][V1]+[M2][V2]$, where $[T]$ is a $1 \times N$ matrix of thermal values for the N computing components, $[M1]$ is a first $N \times N$ matrix of thermal influence coefficients, $[V1]$ is a first $1 \times N$ matrix of N first measurements, $[M2]$ is a second $N \times N$ matrix of thermal influence coefficients, and $[V2]$ is a second $1 \times N$ matrix of N second measurements of a different type than the first measurements. The N first measurements may be power draws of the N computing components or utilizations of the N computing components.

The first computing component may be a first computer and the second computing component may be a second computer. The first computing component may be a first group of computers and the second computing component may be a second group of computers. The first computing component may be a first component of a computer and the second computing component may be a second component of a computer. The second component may be a central processing unit of the computer, a storage device of the computer, a memory module of the computer, or a motherboard of the computer.

Modifying an operational or physical parameter of the system may include one or more of adjusting a performance of the first computing component in a manner that reduces heat generated by the first computing component, controlling a cooling system to increase a rate of heat removal from the first computing component, generating an alarm, or changing a physical placement of the first computing component.

Implementations of the described techniques may include a system, a method or process, or computer software on a computer-accessible medium.

Advantages can include one or more of the following. Determination of the thermal health of a computer or aggregation of computers can be made more accurately, thereby improving reliability and reducing down-time of a data center.

The details of one or more implementations are set forth in the accompanying drawings and the description below. Other features, objects, and advantages will be apparent from the description and drawings, and from the claims.

DETAILED DESCRIPTION

Figure 1A:
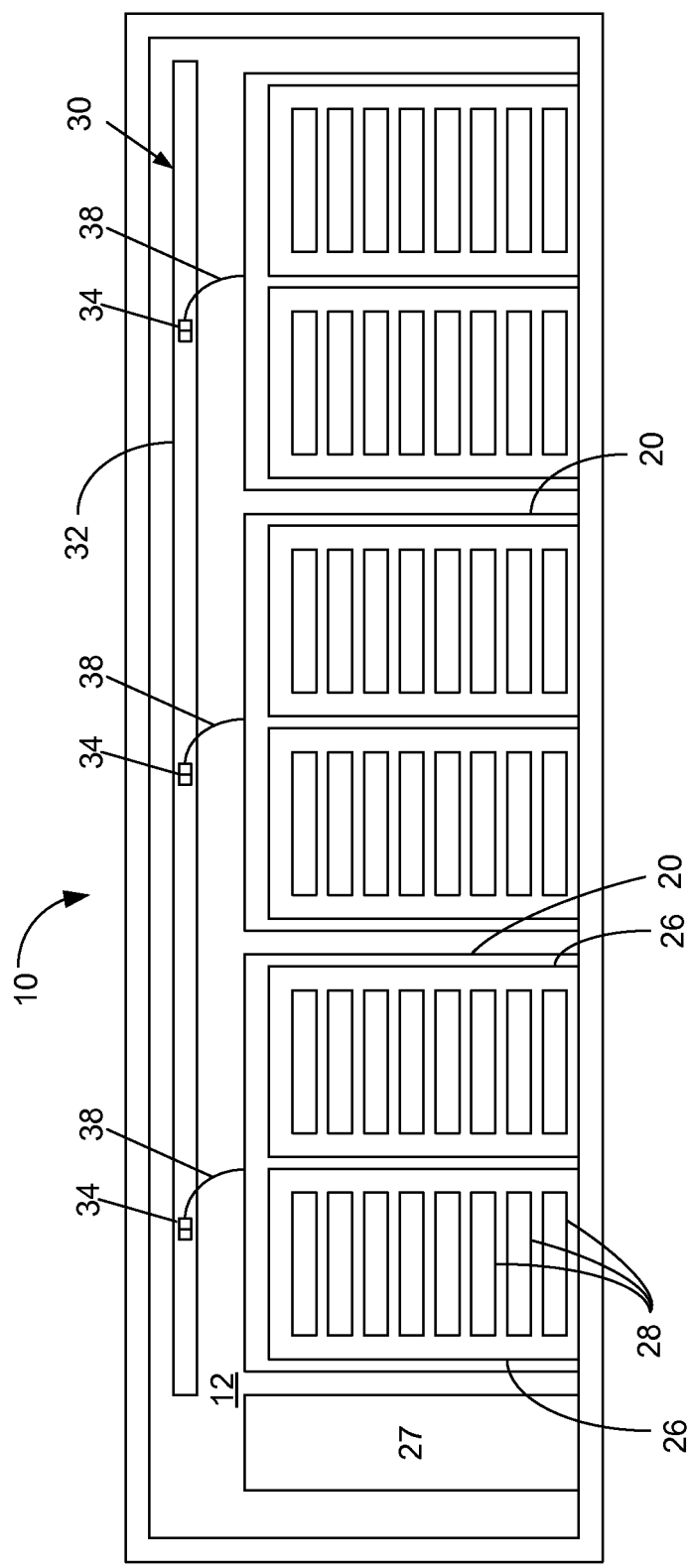
FIGS. 1A and 1B are sectional side and plan views, respectively, of a facility operating as a data center.

Large-scale Internet services and the massively parallel computing infrastructure that is required to support them can require the design of warehouse-sized computing systems, e.g., data center facilities, made up of thousands or tens of thousands of computing nodes, their associated storage hierarchy and interconnection infrastructure. The data center can include many different types of computer equipment, e.g., different types of computers, and each piece of equipment is typically constructed from multiple smaller electronic components.

As noted above, computer components can generate heat. Thermal events, e.g., situations in which the temperature of the computer components rises sufficiently high to cause short-term performance impairment or reduce long-term reliability, can be caused by a variety of factors, such as cooling plant failures, deployment of too many computers in close proximity (so that the local heat generated is greater than the local cooling capabilities of the cooling system), excessive utilization, and season variations.

Heat can be transferred from one computer to another. For example, in an extreme case that would not be good airflow management, the exhaust air from a first computer could blow directly into the intake of a second computer. Thus, heat generated by the first computer will have a significant effect on the thermal performance of the second computer. In general, airflow management and system design can significantly reduce, but may not eliminate thermal effects of one computer on another. In addition, as computing systems become larger, e.g., with hundreds or thousands of computers, it becomes more difficult to understand the impact of one computer on another.

In order to account for the effect of heat transfer between computers discussed above, the temperature of one computer can be calculated based at least on measurements indicative of temperatures of other computers. In some implementations, the temperature of one computer is calculated based on both a measurement indicative of temperature of the one computer and measurements indicative of temperatures of other computers. The calculation takes into account the heat transfer characteristics from the other computers to the one computer.

The measurements indicative of temperature can be measurements of power draw, utilization and/or fan/pump speed (or other measure of the flow rate of a cooling gas or liquid). Optionally, the measurements can additionally include actual temperature measurements of components in the other computers. The calculation of the temperature of the one computer need not be based on measurements of the actual temperature of the one computer or components of the one computer (since if this data was known, it could provide a direct measurement of the actual temperature of the one computer and calculations based on the contribution by other computers might not be needed).

Similarly, in order to account for the effect of heat transfer between aggregations of computers, an aggregate temperature of one group of computers can be calculated based at least on measurements indicative of temperatures of computers that are not part of the group. In some implementations, the aggregate temperature of one group of computers is calculated based on both a measurement indicative of temperature of the one group of computers and measurements indicative of temperatures of computers that are not part of the group. The calculation takes into account the capacity for heat transfer from other aggregations of computers to the one aggregation of computers.

Again, the measurements indicative of temperature can be measurements (either singly or in the aggregate) of power draw, utilization and/or fan/pump speed (or other indication of flow rate of a cooling medium) of the other computers that are not part of the group. Optionally, the measurements can additionally include actual temperature measurements of components of the other computers that are not part of the aggregate, calculations of aggregate temperatures for other aggregations of computers, and/or actual temperature measurements of the environment of other aggregations of computers (e.g., the air temperature within a rack of computers). However, the calculation of the aggregate temperature of the group of computers need not be based on measurements of the actual temperatures of the computers or the environment in the group of computers (again, if this data was known, it could provide a direct measurement of the actual aggregate temperature of the computer of the group and calculations based on the contribution by other computers might not be needed).

In order to account for the effect of heat transfer between components of a computer, a temperature of one component of a computer can be calculated based at least on measurements indicative of temperatures of other components of the same computer. In some implementations, the temperature of one component of the computer is calculated based on both a measurement indicative of temperature of the one component of the computer and measurements indicative of temperatures of other components of the same computer. The calculation takes into account the capacity for heat transfer from other component of the computer other components of the computer.

The measurements indicative of temperature of the component can be measurements of power draw or utilization of the other components. Optionally, the measurements can additionally include actual temperature measurements of components of the computer. However, the calculation of the temperature of the component need not be based on measurements of the actual temperature of the component (again, if this data was known, it could provide a direct measurement of the actual temperature of the component of the computer and calculations based on the contribution by other components might not be needed). In addition, in some implementations, a measurement indicative of the temperature of a component of a computer can be used as a stand-in for the measurement indicative of the temperature of a computer, in either the calculation of the temperature of a computer or a group of computers. For example, the power draw or utilization of a CPU of a first computer could be used as the measurement indicative of the temperature of the first computer in the calculation of the temperature of a second computer. Also, in some implementations, a measurement indicative of temperature of a component of a computer can be used as a stand-in for the measurement indicative of the temperature of a computer, in either the calculation of the temperature of a computer or a group of computers.

Although the term "temperature" is used above, the same principals can be applied to calculation of a thermal health value that acts as a stand-in value for the temperature of a computer, group of computers, or component of a computer. The thermal health value can be calculated from measurements indicative of temperatures of other computers, computers that are not part of the group, or other components of the computer, respectively. The thermal health value is in a format that is easier for a non-specialist operator to understand than raw temperature information, e.g., it is "normalized" relative to the thermal operational range of the particular computer, group of computers or component. The term "thermal value" as used herein includes both temperatures and thermal health values.

An example data center facility will be described as an introduction to the thermal monitoring issues.

Figure 1B:
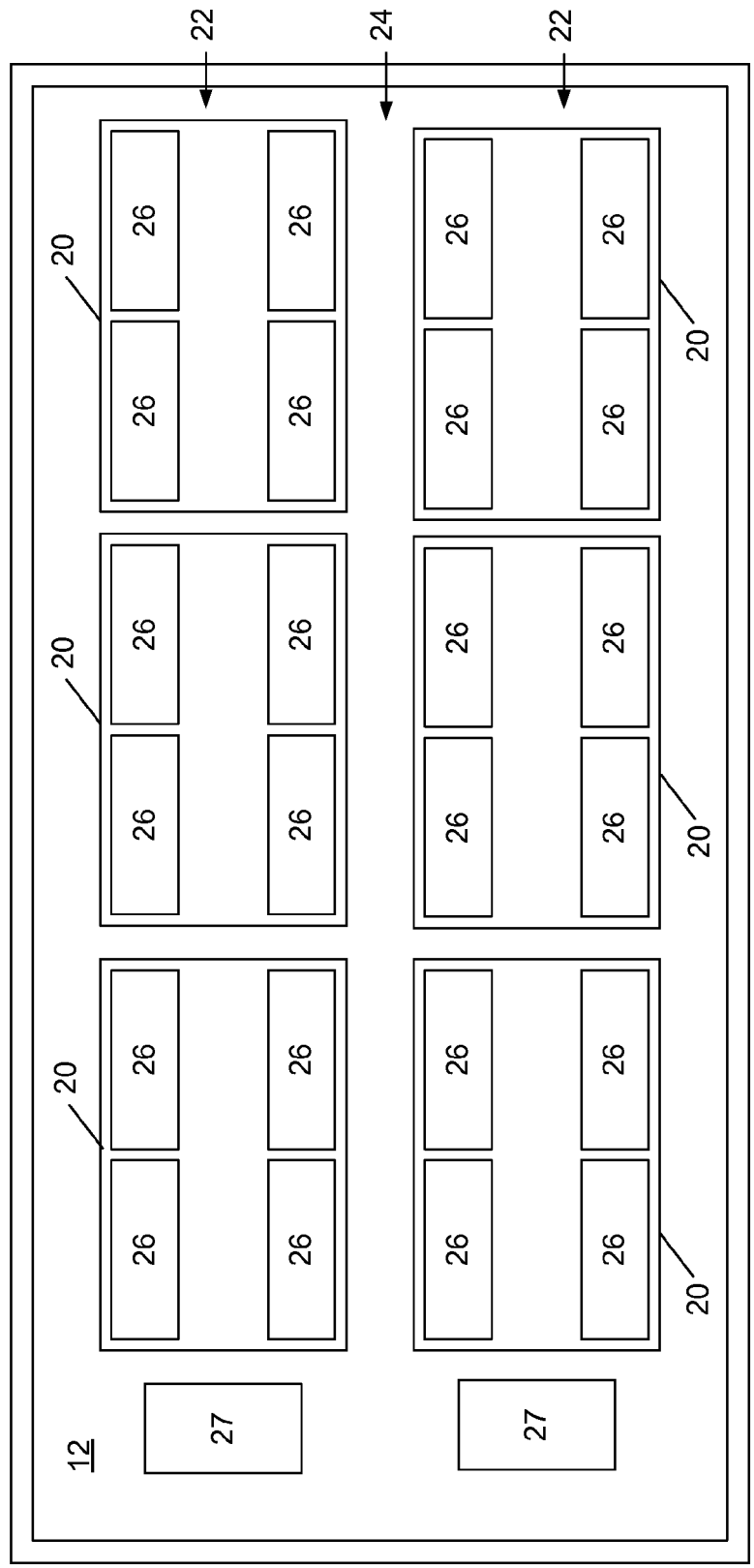

FIGS. 1A and 1B are side and plan views to illustrate an example of a facility 10 that serves as a data center. The facility 10 includes an enclosed space 12 and can occupy essentially an entire building, or be one or more rooms within a building. The enclosed space 12 is sufficiently large for installation of numerous (dozens or hundreds or thousands of) racks of computer equipment, and thus could house hundreds, thousands or tens of thousands of computers.

Modules, e.g., cages 20, of rack-mounted computers are arranged in the space in rows 22 separated by access aisles 24. Each cage 20 can include multiple racks 26, e.g., four to eight racks, and each rack includes multiple computers 28, e.g., trays.

The facility includes a cooling system to remove heat from the data center via one more heat exchange processes. For example, cooling equipment 27 can be situated with respect to a given row to provide cooling of the computers in that row. Cooling equipment 27 may include, e.g., an air conditioning system to blow cold air through the row, or cooling coils that carry a liquid coolant past the racks.

The facility also includes a power grid 30 which, in this implementation, includes a plurality of power distribution "lines" 32 that run parallel to the rows 22. Each power distribution line 32 includes regularly spaced power taps 34, e.g., outlets or receptacles. The power distribution lines 32 may be busbars suspended on or from a ceiling of the facility. Alternatively, busbars could be replaced by groups of outlets independently wired back to the power supply, e.g., elongated plug strips or receptacles connected to the power supply by electrical whips. As shown, each module 20 can be connected to an adjacent power tap 34, e.g., by power cabling 38.

Figures 1C, 3:
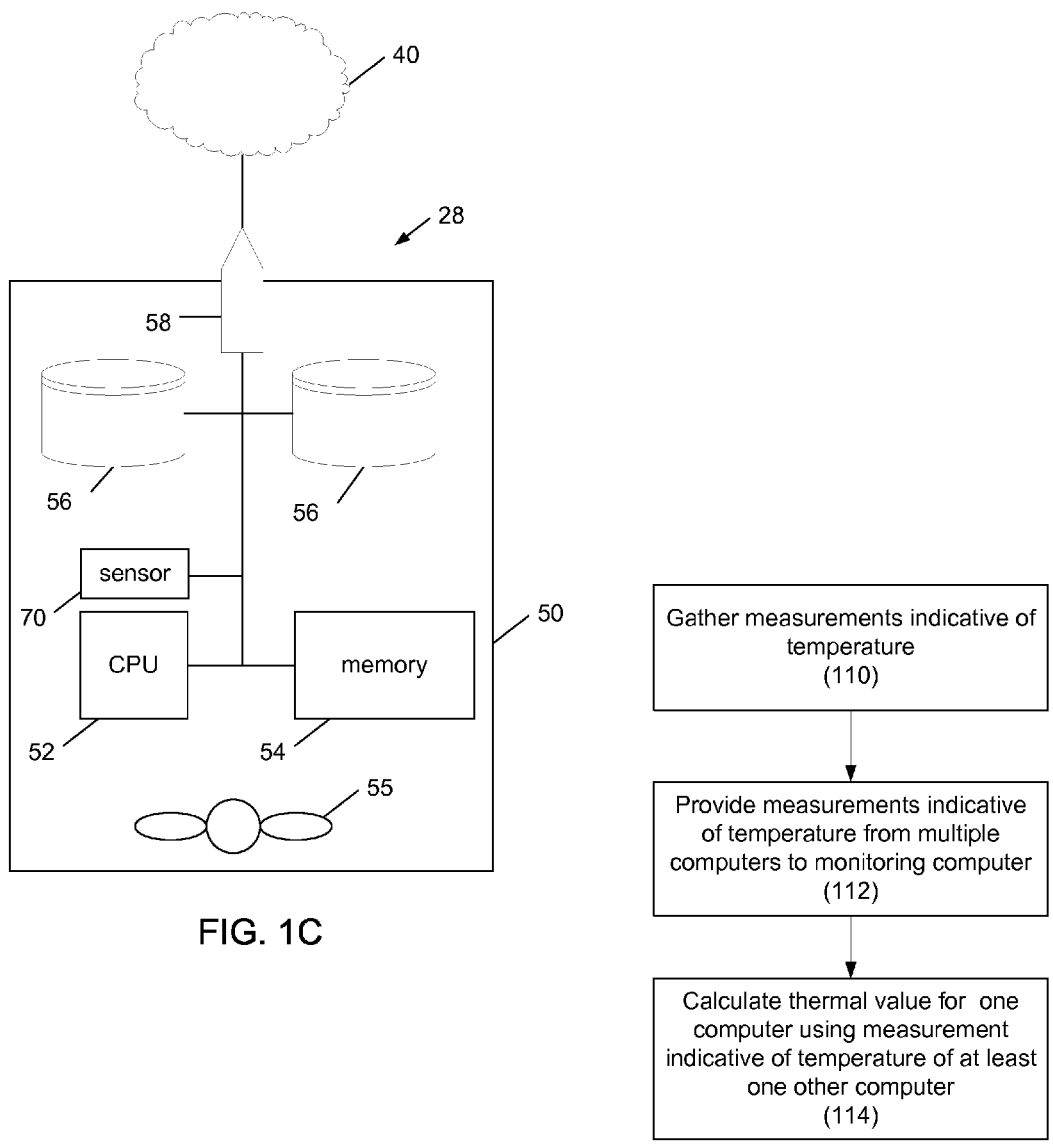
FIG. 1C is a schematic view of the components of a computer in the data center.
FIG. 3 is flowchart illustrating a method of thermally monitoring a data center.

FIG. 1C is a schematic view of a computer from a rack. In general, each computer 28 can include a circuit board 50, such as a motherboard, on which a variety of computer-related components are mounted, such as a central processing unit (CPU) 52, memory 54, one or more storage devices 56, and an input/output port 58 to connect the computer to the network of other computers in the data center. The computer 28 also includes one or more computer level cooling devices 55, such as a fan or a fluid (e.g., liquid) pump. In addition, the computer is coupled by the input/output port 58 to a data grid 40 that can carry data between the computers and an external network, e.g., the Internet.

As mentioned above, components of a computer, such as a microprocessor, memory or disk drive, can fail when subject to high temperatures. However, the exact temperature at which failures occur vary for platforms of differing configuration. For example, different models of CPUs will begin failing at different temperatures. Thus, even if temperature data is available, the temperature data itself does not necessarily provide useful information regarding the thermal health of the machine, much less a collection of machines having different configurations such as typically occurs in a data center.

Thus, it may be useful to the human operator of a data center to have an indication of the thermal condition of a computer, or group of computers, that does not require knowledge of the particular platform to evaluate whether the computer is failing or is in danger of failure. Failure can include either reduced performance, or irreparable damage, or both, and different types of failure can receive different weightings in determining the thermal health. For example, at lower temperatures the computer will operate normally and can be considered "healthy," at higher temperatures performance may be reduced, at even higher temperatures certain errors may occur and the computer can be considered "unhealthy," and once the computer fails entirely it can be considered "dead."

This general indication of the thermal condition of the computer can be termed a "thermal health variable", which can have a "thermal health value". Thus, the thermal health variable may be a metric, typically a non-dimensional metric, of the thermal condition of a single computer or aggregation of computers in the data center, but which is independent of the particular configuration of the computer. The thermal health value may be calculated to fall within a scale shared across multiple computers, e.g., across all computers of a data center, with at least the endpoints of the shared scale (and potentially at least some middle points in the scale) representing similar behavior of the computers.

As noted above, a thermal value can be calculated for a computer, a group of computers, or a component of a computer, based at least on measurements indicative of temperatures of other computers, computers that are not part of the group, or other components of the computer, respectively.

Figure 2:
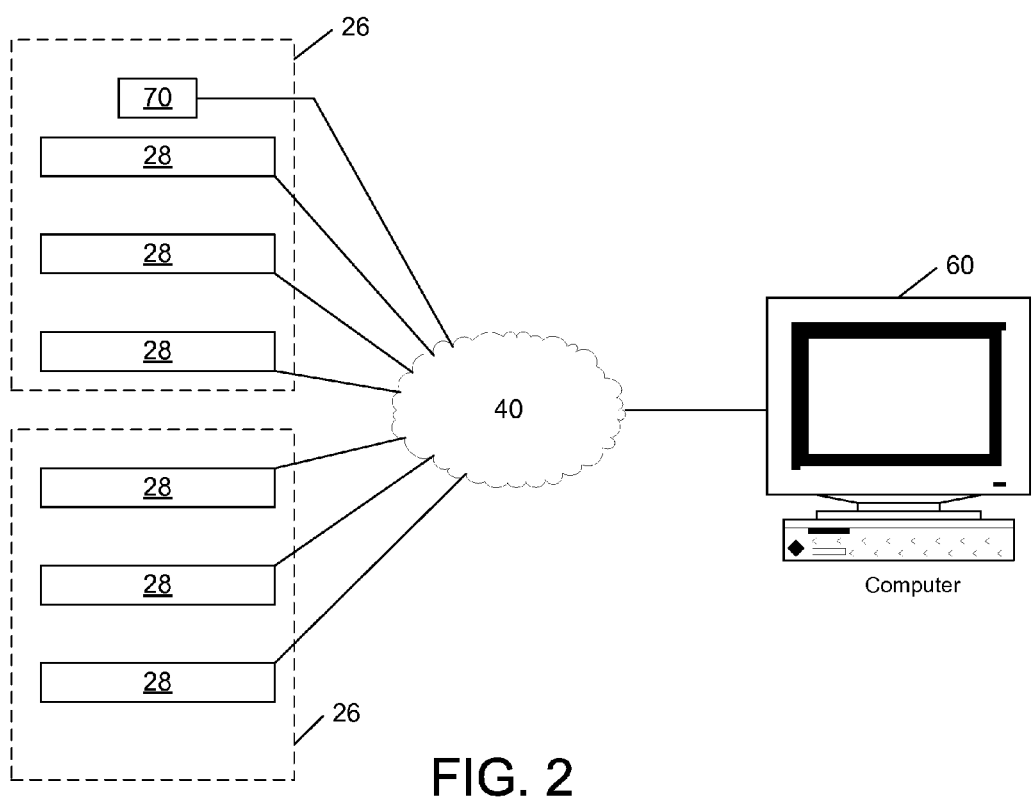
FIG. 2 is a schematic illustration of computers of a data center configured to provide utilization, power or temperature information to a monitoring computer.

FIG. 2 is a schematic diagram of a system for determining thermal value. At least some of the computers 28 in the data center are connected through a network, e.g., the data grid 40, to a monitoring computer 60, such as a general purpose computer, e.g., a workstation.

Each computer 28 can gather measurements indicative of its temperature or indicative of the temperature of its components, e.g., utilization, power draw and/or fan/pump speed (step 110 in FIG. 3), and provide this data to the monitoring computer 60 over the data grid 40 (step 112 in FIG. 3). Optionally, some of the computers 28 can include at least one sensor 70 (see FIG. 1C) that measures a temperature of at least one of the components, e.g., the CPU, in the computer. For example, a computer 28 can include sensors to measure the temperature of the CPU, memory, hard drive or motherboard. In addition, there can be sensors 72 installed in the racks 26 or cages 20 to measure the temperature of the environment, e.g., the air near the computers 28, and this data can be sent to the monitoring computer 60 to be used in the determination of temperature or thermal health. A thermal value can be calculated for one computer using measurement indicative of temperature of at least one other computer (step 114 in FIG. 3). The monitoring computer 60 can receive thermal data from other tray-level thermal sensors, and from other rack or cage-level sensors, e.g., sensors that monitor the cooling infrastructure for a rack or cage, e.g., that measure the entering air temperature (EAT), leaving air temperature (LAT), entering water temperature (EWT) and leaving water temperature (LWT).

In some implementations, some or all computers send their measurements to a monitoring computer 60, and the monitoring computer 60 calculates the thermal value for each computer based on the received data. The monitoring computer 60 can receive thermal data from other tray-level or rack-level thermal sensors, and this data can also be used in the calculation of the temperature for each computer. In some implementations, the data necessary for calculation of a thermal value is directed to the individual computers, and each computer calculates its own thermal value. For example, measurements indicative of temperature can be collected from multiple computers 28 by the monitoring computer 60, and the measurements forwarded to the individual computers 28. In some implementations, the thermal values calculated by the computers 28 are sent to the monitoring computer 60, and the monitoring computer can calculate an aggregate thermal value for an aggregation of the computers 28.

Turning now to the actual calculation of a thermal value, a variety of approaches are possible.

In a simple example, a thermal value for a first computer, group of computers or component of a first computer can be calculated based on a first measurement indicative of the temperature of the first computer, group of computers or component of the a computer and a second measurement indicative of the temperature of a second computer, group of computers or component of the a computer. Thus, calculation of a thermal value $T_1$ can be expressed as:

$$T_1 = m_1 I_1 + m_2 I_2 \quad \text{(Equation A)}$$

where $I_1$ and $I_2$ are the measured input values for the first computer, group, or component and the second computer, group, or component, respectively, and $m_1$ and $m_2$ are constants. It is to be expected that $m_1$ is greater than $m_2$.

In a more complex example, a thermal value for a computer in a group of computers, for a group of computers in a group of computers, or a component in a group of components, can be calculated based on measurements indicative of temperatures from multiple other computers, groups of computers or components in the group, using a thermal influence matrix and matrix multiplication. Where there are N elements, e.g., computers, groups of computers or components, in the group, for the thermal values $T_1, T_2 \ldots T_N$ of N elements, the matrix multiplication can take the general form of:

$$\begin{bmatrix} T_1 \\ T_2 \\ \vdots \\ T_N \end{bmatrix} = [M] \begin{bmatrix} I_1 \\ I_2 \\ \vdots \\ I_N \end{bmatrix} \quad \text{(Equation B)}$$

where $I_1, I_2 \ldots I_N$ are measured input values indicative of the temperature of the elements, and $[M]$ is a thermal influence matrix, e.g., an N×N matrix of thermal influence values. The thermal influence matrix will have at least one row that includes at least two different non-zero values. In some implementations, the input values $I_1, I_2 \ldots I_N$ are all the same type of measurement, e.g., all measurements of power draw.

The membership of the group, and thus the number of elements N in the group, can be based on physical proximity and a priori evaluation of which elements are likely to be thermally influenced by other elements. For example, for calculation of the thermal value for a component of a computer, a logical grouping is the components of the computer. In this example, N is likely to be between 10 and 50. As another example, for calculation of the thermal value for a computer, a logical grouping is the computers in the rack or cage containing the computer. In this example, N is likely to be between 50 and 100. For example, a typical enclosure might include 40 computers. As another example, for calculation of the thermal value for a rack or cage of computers, a logical grouping is a row or cluster of racks or cages. As such, N is likely to be between 10 and 50.

In one example, a thermal value for one computer in a rack can be calculated based on measurements indicative of temperatures of the one computer and two adjacent computers, e.g., the computers above and below the one computer. As one example, if the thermal value is to be calculated based on utilization, then thermal value $T_X$ of computer X in a rack (the one computer) can be expressed as:

$$T_X = a_1 U_{X-1} + a_2 U_X + a_3 U_{X+1} \quad \text{(Equation 1)}$$

where $U_X$ is the utilization of computer X, $U_{X-1}$ and $U_{X+2}$ are the utilization of adjacent computers X−1 and X+1, and $a_1$, $a_2$, and $a_3$ are thermal influence constants (e.g., $a_1$ represents the influence of the utilization of the adjacent computer X−1 on the thermal value of the computer X). It is to be expected that $a_2$ is greater than $a_1$ and $a_3$. In some implementations, $a_1 = a_3$.

As another example, the thermal values $T_1, T_2 \ldots T_N$ of N computers in a rack can be calculated as:

$$\begin{bmatrix} T_1 \\ T_2 \\ \vdots \\ T_N \end{bmatrix} = \begin{bmatrix} a_{11} & a_{12} & \cdots & a_{1N} \\ a_{21} & a_{22} & & \\ \vdots & & \ddots & \vdots \\ a_{N1} & & \cdots & a_{NN} \end{bmatrix} \begin{bmatrix} U_1 \\ U_2 \\ \vdots \\ U_N \end{bmatrix} \quad \text{(Equation 2)}$$

where $a_{11}, a_{12} \ldots a_{NN}$ are thermal influence constants (e.g., $a_{12}$ represents the influence of the utilization of the second computer on the thermal value of the first computer), and $U_1, U_2 \ldots U_N$ are the utilizations of the computers 1, 2, . . . , N, respectively.

Instead of utilization, the thermal value calculation can be based on power draw by the computers. For example, the thermal value $T_X$ of computer X in a rack (the one computer) can be expressed as:

$$T_X = b_1 P_{X-1} + b_2 P_X + b_3 P_{X+1} \quad \text{(Equation 3)}$$

where $P_X$ is the power draw by computer X, $P_{X-1}$ and $P_{X+1}$ are the power draws by adjacent computers X−1 and X+1, and $b_1$, $b_2$, and $b_3$ are thermal influence constants (e.g., $b_1$ represents the influence of the power draw of the adjacent computer X−1 on the thermal value of the computer X).

If the thermal values are to calculated using a thermal influence matrix, then the thermal values $T_1, T_2 \ldots T_N$ of N computers can be calculated as $$\begin{bmatrix} T_1 \\ T_2 \\ \vdots \\ T_N \end{bmatrix} = \begin{bmatrix} b_{11} & b_{12} & \ldots & b_{1N} \\ b_{21} & b_{22} & & \\ \vdots & & \ddots & \vdots \\ b_{N1} & & \ldots & b_{NN} \end{bmatrix} \begin{bmatrix} P_1 \\ P_2 \\ \vdots \\ P_N \end{bmatrix} \quad \text{(Equation 4)}$$

where $b_{11}, b_{12} \ldots b_{NN}$ are thermal influence constants (e.g., $b_{12}$ represents the influence of the power draw of the second computer on the thermal value of the first computer), and $P_1, P_2 \ldots P_N$ are the power drawn by the computers 1, 2, . . . N, respectively.

In addition, the measurement indicative of temperature used in any of the above calculations can be the fan speed for the computer, for example, if the fan is a variable speed fan.

In the examples above, the thermal value is calculated based on a single type of measurement. However, in some implementations, different types of measurements can be combined in the calculation of the thermal value. For example the thermal value $T_X$ of computer X can be expressed as:

$$T_X = a_1 U_{X-1} + a_2 U_X + a_3 U_{X+1} + b_1 P_{X-1} + b_2 P_X + b_3 P_{X+1} \quad \text{(Equation 5)}$$

and if the thermal values are to calculated using a thermal influence matrix, then the thermal values $T_1, T_2 \ldots T_N$ of N computers can be calculated as:

$$\begin{bmatrix} T_1 \\ T_2 \\ \vdots \\ T_N \end{bmatrix} = \begin{bmatrix} a_{11} & a_{12} & \ldots & a_{1N} \\ a_{21} & a_{22} & & \\ \vdots & & \ddots & \vdots \\ a_{N1} & & \ldots & a_{NN} \end{bmatrix} \begin{bmatrix} U_1 \\ U_2 \\ \vdots \\ U_N \end{bmatrix} + \begin{bmatrix} b_{11} & b_{12} & \ldots & b_{1N} \\ b_{21} & b_{22} & & \\ \vdots & & \ddots & \vdots \\ b_{N1} & & \ldots & b_{NN} \end{bmatrix} \begin{bmatrix} P_1 \\ P_2 \\ \vdots \\ P_N \end{bmatrix} \quad \text{(Equation 6)}$$

In the examples above, the thermal value is calculated without using actual temperature measurements. However, in some implementations, which can be combined with any of the approaches set out above, at least one actual temperature measurement is used in calculation of the thermal value of the computer. For example, the actual temperature measurement can be a measurement of the temperature of the environment near the computer, e.g., the temperature in the rack, or the ambient air temperature in the data center.

In general, an actual temperature measurement of the environment can be integrated into any of the above equations as an offset value. For example, the thermal value $T_X$ of computer X can be calculated as $$T_X = a_1 U_{X-1} + a_2 U_X + a_3 U_{X+1} + d_E T_E \quad \text{(Equation 7)}$$

where $T_E$ is the environment temperature and $d_E$ is a constant.

With matrix multiplication, the thermal values $T_1, T_2 \ldots T_N$ of N computers can be calculated as:

$$\begin{bmatrix} T_1 \\ T_2 \\ \vdots \\ T_N \end{bmatrix} = \begin{bmatrix} a_{11} & a_{12} & \ldots & a_{1N} \\ a_{21} & a_{22} & & \\ \vdots & & \ddots & \vdots \\ a_{N1} & & \ldots & a_{NN} \end{bmatrix} \begin{bmatrix} U_1 \\ U_2 \\ \vdots \\ U_N \end{bmatrix} + \begin{bmatrix} d_1 \\ d_2 \\ \vdots \\ d_N \end{bmatrix} T_S \quad \text{(Equation 8)}$$

where $d_1, d_2 \ldots d_N$ are thermal influence constants representing the influence of the environmental temperature on the computers (e.g., $d_1$ represents the influence of the environmental temperature on the first computer). For a simplified approximation, the values $d_1, d_2 \ldots d_N$ can be equal.

In some implementations, which can be combined with any of the approaches set out above, thermal values are calculated using a second thermal influence matrix that accounts for thermal influence of one or more independent cooling systems, such as cooling systems 27. For example, where there are L independent cooling systems and N computers, the thermal values $T_1, T_2 \ldots T_N$ of N computers can be calculated as $$\begin{bmatrix} T_1 \\ T_2 \\ \vdots \\ T_N \end{bmatrix} = \begin{bmatrix} c_{11} & c_{12} & \ldots & c_{1N} \\ c_{21} & c_{22} & & \\ \vdots & & \ddots & \vdots \\ a_{N1} & & \ldots & c_{NN} \end{bmatrix} \begin{bmatrix} c_{11} & \ldots & c_{1L} \\ \vdots & & \vdots \\ c_{N1} & \ldots & c_{NL} \end{bmatrix} \begin{bmatrix} Q_1 \\ Q_2 \\ \vdots \\ Q_L \end{bmatrix} + \begin{bmatrix} b_{11} & b_{12} & \ldots & b_{1N} \\ b_{21} & b_{22} & & \\ \vdots & & \ddots & \vdots \\ b_{N1} & & \ldots & b_{NN} \end{bmatrix} \begin{bmatrix} P_1 \\ P_2 \\ \vdots \\ P_N \end{bmatrix} \quad \text{(Equation 9)}$$

where $c_{11}, \ldots c_{LN}$ are thermal influence constants (e.g., $c_{12}$ represents the influence of a second cooling system on the thermal value of the first computer), and $Q_1, Q_2 \ldots Q_L$ is the cooling capacity for the cooling system (in terms of, for example, power (e.g., in kW), air or water flow rates, fan or pump speeds). The values $c_{11}, \ldots c_{LN}$ can be negative to indicates that the greater the capacity of the cooling system, the lower the resulting temperature of the computers.

In some implementations, the matrix [M] can be an M×N matrix, with M>N. For example, for a partially filled rack, M may be the number of slots in the rack and N is the number of computers. In such an example, assuming that slot S of the rack has no computer, then the 1×M row of thermal influence constants in the matrix [M] corresponding to the slot S can be 0, so that no value is calculated for the empty slot (although, depending on the system, an empty slot could actually provide cooling (<0) or heating (>0) to other computers). Mathematically this is equivalent to the N×N matrix, but may be easier to update when a new computer is added to a rack.

In the examples above, the thermal value is calculated for a single computer. However, in general, the discussion and equations above can also be applied to calculation of aggregate thermal values for aggregations (called groups below) of computers, e.g., by substituting an aggregate utilization, power draw or fan/pump speed value of a group of computers for the utilization, power draw or fan/pump speed, as the case may be, of the individual computer, and using the thermal influence constants to account for heat transfer between the groups of computers.

For example, an aggregate thermal value for a group of computers, e.g., a rack, can be calculated based on measurements indicative of temperatures of the group and two other groups, e.g., physically adjacent racks, of computers. As one example, if the aggregate thermal value is to be calculated based on utilization, the aggregate thermal value $T'_X$ of a group of computers, e.g., the computers in rack, can be expressed as:

$$T'_X = a'_1 U'_{X-1} + a'_2 U'_X + a'_3 U'_{X+1} \quad \text{(Equation 10)}$$

where $U'_X$ is the utilization of the group X, $U_{X-1}$ and $U_{X+1}$ are the utilization of adjacent groups, e.g., adjacent racks, and $a'_1$, $a'_2$, and $a'_3$ are constants.

Similarly, an aggregate thermal value for a group of computers can be calculated based on measurements indicative of aggregate temperatures from multiple other groups of computers using a thermal influence matrix and matrix multiplication. As one example, if the aggregate thermal values $T'_1, T'_2 \ldots T'_N$ of N groups, e.g., racks, of computers can be calculated as:

$$\begin{bmatrix} T'_1 \\ T'_2 \\ \vdots \\ T'_N \end{bmatrix} = \begin{bmatrix} a'_{11} & a'_{12} & \ldots & a'_{1N} \\ a'_{21} & a'_{22} & & \\ \vdots & & \ddots & \vdots \\ a'_{N1} & & \ldots & a'_{NN} \end{bmatrix} \begin{bmatrix} U'_1 \\ U'_2 \\ \vdots \\ U'_N \end{bmatrix} \quad \text{(Equation 11)}$$

where $a'_{11}, a'_{12} \ldots a'N_N$ are thermal influence constants (e.g., $a_{12}$ represents the influence of the utilization of the second group of computers, e.g., the second rack, on the thermal value of the first group of computers, e.g., the first rack), and $U'_1, U'_2 \ldots U'_N$ are the utilizations of the groups of computers.

Although aggregation of computers at the rack level is discussed above, computers can be aggregated into groups based on higher level aggregations, e.g., modules, rows or clusters of computers.

In addition, the same principals can be applied at a component level of a computer. That is, thermal values can be calculated for multiple components within a computer, with a thermal influence matrix accounting for heat transfer between components of the computer. As one example, the component thermal values $T''_1, T''_2 \ldots T''_N$ of N components, e.g., microprocessor, RAM, disc, etc., of a computer can be calculated as:

$$\begin{bmatrix} T''_1 \\ T''_2 \\ \vdots \\ T''_N \end{bmatrix} = \begin{bmatrix} a''_{11} & a''_{12} & \ldots & a''_{1N} \\ a''_{21} & a''_{22} & & \\ \vdots & & \ddots & \vdots \\ a''_{N1} & & \ldots & a''_{NN} \end{bmatrix} \begin{bmatrix} U''_1 \\ U''_2 \\ \vdots \\ U''_N \end{bmatrix} \quad \text{(Equation 12)}$$

where $a''_{11}, a''_{12} \ldots a''N_N$ are thermal influence constants (e.g., $a''_{12}$ represents the influence of the utilization of the second component, e.g., the CPU, on the thermal value of the first component, e.g., RAM), and $U''_1, U''_2 \ldots U''_N$ are the utilizations of the individual components.

The thermal influence constants can be determined with a "brute force" approach. For example, an experimental setup can be constructed in which temperature sensors are located at each component or computer. The computers can then be operated at a variety of preset power draws, utilization, etc., and the temperature of the components or computers measured with the sensors. From this data, the thermal influence constants can be determined empirically. Also, the computers can simply be run under normal conditions until sufficient historical run time data is accumulated to solve for the thermal influence constants.

The thermal influence constants can also be determined by modeling. For example, a model can be constructed from a combination of physical first principals, some empirical data, computational flow dynamics, thermodynamics, heat transfer, and the like. The models can be hierarchical. For example, a first model can account for heat transfer between components within a computer, a second model can account for heat transfer between computers in a rack, a third model can account for heat transfer between racks in a module, and a fourth model can account for heat transfer between modules in the data center.

The monitoring computer may communicate with the individual computers throughout the data center. Optionally, the monitoring computer can aggregate thermal values for further processing, e.g., the monitoring computer optionally can calculate thermal values for one or more aggregations of computers. A thermal health value of an aggregation can be calculated as the average of the thermal health values of the individual computers in the aggregation, although other techniques such as cumulative distribution functions or mean-square may be applicable.

The aggregation can be a location-based aggregation (that is, based on physical location of the computers). For example, a thermal value can be determined for a group of computers within a given rack, module, row, cluster or data center.

The aggregation can be an infrastructure-based aggregation (that is, based on computers that share a common infrastructure component). For example, a thermal value can be determined for a group of computers within a particular power or cooling domain.

The aggregation can be a service-based aggregation (that is, based on function that the computers perform in the data center, or even based on the customer that the computers serve). For example, a thermal value can be determined for a group of computers in the data center that serve search results, electronic mail or map generation. The aggregation can be a logical network grouping, e.g., based on computers within a particular networking domain or subdomain.

Once the thermal value has been determined, it can be used, e.g., automatically by control software, to adjust the performance of the computers to avoid thermal failure. For example, if the thermal value exceeds a certain threshold or indicates a warning, then the computers in an aggregation can be throttled, e.g., by redirecting computing tasks to other computers so as to reduce utilization of the computers in the aggregation and thus reduce power use and temperature. As another example, the thermal value can be used to control the cooling system or other cooling resources, e.g., if the thermal value exceeds a certain threshold then the rate of heat removal can be increased to lower the temperature of the computers and reduce the risk of failure. Conversely, if the thermal value has not exceeded a certain threshold, this can indicate that the computers have some margin to operate at higher temperature, and the rate of heat removal can be decreased to reduce cooling costs. In extreme situations, one or more computers that exceed a critical threshold can be automatically shut down to avoid permanent damage to the computer components. In some implementations, the thermal value may exceed the threshold by going above the threshold, while, in other implementations, the thermal value may exceed the threshold by going below the threshold.

The monitoring computer can automatically generate an alarm to alert the data center operator if a thermal value crosses a threshold, e.g., exceeds some preset value. For example, a rack-level thermal health value can be generated as the average thermal health value of all computers in a given rack.

The thermal value can also be used to make decisions regarding machine placement. For example, by comparing the thermal values aggregated at the rack level, an operator can determine which racks have greater capacity to handle additional thermal loads (e.g., under the presumption that racks with the lowest thermal health values are best able to handle additional thermal loads). Placement of new machines into the racks with the greater capacity to handle additional thermal loads can then be prioritized. This information can additionally or alternatively be used to make decisions with respect to the placement of racks.

Various steps of the processes discussed above, particularly the calculation of the thermal health value, are performed by computer. Some steps, such as shutting down computers in response to elevated danger levels of the thermal health variable, can be performed by human operators in response to receiving the thermal health variable, e.g., when displayed, or automatically by control software, e.g., in the monitoring computer.

Embodiments and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine readable storage device, such as a memory or disk, or in a propagated signal, for execution by, or to control the operation of, data processing apparatus, e.g., a programmable processor, a computer, or multiple processors or computers.

A number of embodiments of the invention have been described. Nevertheless, it will be understood that various modifications may be made. Accordingly, other embodiments are within the scope of the following claims.

What is claimed is:

1. A method for controlling a system that includes a first group of computers and a second group of computers, the method implemented by one or more processing devices and comprising:
    receiving a first measurement indicative of a temperature of a first group of computers;
    receiving a second measurement indicative of a temperature of a second group of computers;
    calculating a thermal value indicating a risk of failure due to thermal influences for the first group of computers, wherein calculation of the thermal value is based on the first measurement, the second measurement, a configuration of the first group of computers, and one or more thermal influence coefficients, wherein the thermal influence coefficients relate the second measurement to an effect of heat generated by the second group of computers on thermal properties of the first computing device;
    determining that the calculated thermal value exceeds a threshold; and
    in response to determining that the calculated thermal value exceeds the threshold, modifying an operational or physical parameter of the system.

2. The method of claim 1, wherein the first measurement comprises one or more of a power draw of the first group of computers, a utilization of the first group of computers, or a rotation rate of a fan of the first group of computers.

3. The method of claim 2, wherein the second measurement comprises one or more of a temperature of the second group of computers, a power draw of the second group of computers, a utilization of the second group of computers, or a rotation rate of a fan of the second group of computers.

4. The method of claim 3, wherein at least one of receiving the first measurement or receiving the second measurement comprises receiving multiple measurements of different types and wherein calculating the thermal value comprises combining the multiple measurements.

5. The method of claim 1, further comprising receiving N measurements indicative of N groups of computers, the N groups of computers including the first group of computers and the second group of computers, and calculating a thermal value for each of the N groups of computers based on the N measurements, where N>2.

6. The method of claim 5, wherein calculating the thermal value includes calculating $[T]=[M][V]$, where $[T]$ is a $1 \times N$ matrix of thermal values for the N groups of computers, $[M]$ is an $N \times N$ matrix of thermal influence coefficients, and $[V]$ is a $1 \times N$ matrix of the N measurements.

7. The method of claim 6, wherein the N measurements comprise power draws of the N groups of computers, utilizations of the N groups of computers, or rotation rates of fans of the N groups of computers.

8. The method of claim 5, wherein calculating the thermal value includes calculating $[T]=[M1][V1]+[M2][V2]$, where $[T]$ is a $1 \times N$ matrix of thermal values for the N groups of computers, $[M1]$ is a first $N \times N$ matrix of thermal influence coefficients, $[V1]$ is a first $1 \times N$ matrix of N first measurements, $[M2]$ is a second $N \times N$ matrix of thermal influence coefficients, and $[V2]$ is a second $1 \times N$ matrix of N second measurements of a different type than the first measurements.

9. The method of claim 5, further comprising aggregating the thermal values across one or more of a power domain, a cooling domain, a logical domain, or a physical location domain.

10. The method of claim 1, wherein modifying an operational or physical parameter of the system includes controlling a cooling system to increase a rate of heat removal from the first group of computers.

11. The method of claim 1, wherein the one or more thermal influence coefficients relate the second measurement to an effect of heat generated by the second group of computers on the first group of computers by radiation, advection, or convection.

12. A system comprising:
    a first group of computers;
    a second group of computers; and
    a monitoring system configured to:
        receive a first measurement indicative of a temperature of a first group of computers;
        receive a second measurement indicative of a temperature of a second group of computers;
        calculate a thermal value indicating a risk of failure due to thermal influences for the first group of computers, wherein calculation of the thermal value is based on the first measurement, second measurement, a configuration of the first group of computers, and one or more thermal influence coefficients, wherein the thermal influence coefficients relate the second measurement to an effect of heat generated by the second group of computers on thermal properties of the first group of computers;
        determine that the calculated thermal value exceeds a threshold; and
        in response to determining that the calculated thermal value exceeds the threshold, modify an operational or physical parameter of the system.

13. The system of claim 12, wherein the first measurement comprises one or more of a power draw of the first group of computers, a utilization of the first group of computers, or a rotation rate of a fan of the first group of computers.

14. The system of claim 13, wherein the second measurement comprises one or more of a temperature of the second group of computers, a power draw of the second group of computers, a utilization of the second group of computers, or a rotation rate of a fan of the second group of computers.

15. The system of claim 14, wherein at least one of receiving the first measurement or receiving the second measurement comprises receiving multiple measurements of different types and wherein calculating the thermal value comprises combining the multiple measurements.

16. The system of claim 12, further comprising receiving N measurements indicative of N groups of computers, the N groups of computers including the first group of computers and the second group of computers, and calculating a thermal value for each of the N groups of computers based on the N measurements, where N>2.

17. The system of claim 16, wherein calculating the thermal value includes calculating $[T]=[M][V]$, where $[T]$ is a 1×N matrix of thermal values for the N groups of computers, $[M]$ is an N×N matrix of thermal influence coefficients, and $[V]$ is a 1×N matrix of the N measurements.

18. The system of claim 17, wherein the N measurements comprise power draws of the N groups of computers, utilizations of the N groups of computers, or rotation rates of fans of the N groups of computers.

19. The system of claim 16, wherein calculating the thermal value includes calculating $[T]=[M1][V1]+[M2][V2]$, where $[T]$ is a 1×N matrix of thermal values for the N groups of computers, $[M1]$ is a first N×N matrix of thermal influence coefficients, $[V1]$ is a first 1×N matrix of N first measurements, $[M2]$ is a second N×N matrix of thermal influence coefficients, and $[V2]$ is a second 1×N matrix of N second measurements of a different type than the first measurements.

20. The system of claim 16, further comprising aggregating the thermal values across one or more of a power domain, a cooling domain, a logical domain, or a physical location domain.

21. The system of claim 12, wherein modifying an operational or physical parameter of the system includes controlling a cooling system to increase a rate of heat removal from the first group of computers.

22. The system of claim 12, wherein the one or more thermal influence coefficients relate the second measurement to an effect of heat generated by the second group of computers on the first group of computers by radiation, advection, or convection.

\* \* \* \* \*